(12) United States Patent
Schneider et al.

(10) Patent No.: US 6,314,135 B1
(45) Date of Patent: *Nov. 6, 2001

(54) METHOD AND APPARATUS FOR UPDATING PRECODER COEFFICIENTS IN A DATA COMMUNICATION TRANSMITTER

(75) Inventors: Kevin W. Schneider; Richard L. Goodson; Marc Kimpe, all of Huntsville; Fred T. Y. Chu, Madison, all of AL (US); Tanya Morton, Nashville, TN (US)

(73) Assignee: Adtran, Inc., Huntsville, AL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/143,029

(22) Filed: Aug. 28, 1998

(51) Int. Cl.[7] ............................. H03H 7/30; H03H 7/40; H03K 5/159
(52) U.S. Cl. ........................................... 375/232; 375/285
(58) Field of Search .................................. 375/233, 232, 375/285, 229, 296, 346, 348, 350, 221, 231, 358, 254; 708/323

(56) References Cited

U.S. PATENT DOCUMENTS

| | | |
|---|---|---|
| 5,249,200 * | 9/1993 | Chen et al. . |
| 5,453,797 * | 9/1995 | Nicolas et al. ........................ 348/607 |
| 5,513,216 * | 4/1996 | Gadot et al. ......................... 375/233 |
| 5,881,363 * | 3/1999 | Ghosh et al. ........................ 455/5.1 |

OTHER PUBLICATIONS

"Matched–Transmission Technique for Channels With Intersymbol Interference", Hiroshi Harashima and Hiroshi Miyakawa, IEEE Transactions on Communications, vol. COM–20, No. 4, Aug. 1972.

"HDSL2 Performance with Run–Time Precoder Coefficient Updates", Shawn McCaslin and Nicholas van Bavel, Cicada Semiconductor, Inc., T1E1.4 Technical Subcommittee Working–Group Members.

"Performance Implications of a Non–Adaptive Tomlinson–Harashima Precoder", Eli Shusterman, Orckit Communications LTD, Rockwell Semiconductor Systems, Project T1E1.4 Standards Project (HDSL2).

* cited by examiner

*Primary Examiner*—Chi Pham
*Assistant Examiner*—Jean Corrielus
(74) *Attorney, Agent, or Firm*—Baker Botts; John A. Fogarty, Jr.

(57) ABSTRACT

In a data communication system having a channel with time-varying impairments and further having a transmitter with a precoder, a method and apparatus for updating the precoder coefficients. The method and apparatus is based on the arrangement of a duplicate precoder and correction filter in the receiver, where the correction filter generates incremental coefficients. The incremental coefficients are sent via a back channel to the transmitter and added to the current values of the precoder coefficients. The method and apparatus provide DFE-like performance and do not have the delay problems associated with DFEs.

14 Claims, 6 Drawing Sheets

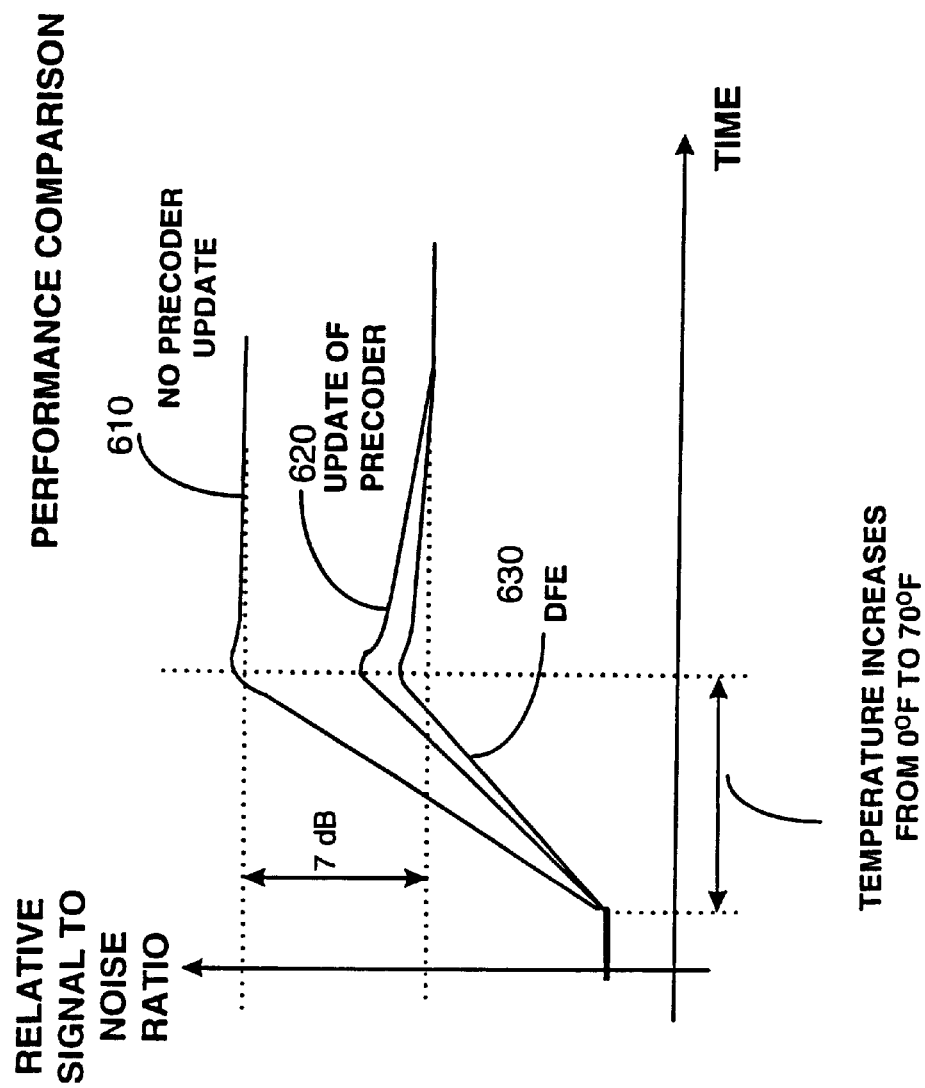

METHOD AND APPARATUS FOR UPDATING PRECODER COEFFICIENTS IN A DATA COMMUNICATION TRANSMITTER

FIELD OF THE INVENTION

This application relates to telecommunication systems and, more specifically, to a method and apparatus for updating precoder coefficient taps in a data communication transmitter. In cases when a decision feedback equalizer cannot be used, a Tomlinson precoder provides a means for compensating for the impairments of a transmission channel, but has limitations when the impairment values of the transmission channel change with time. Hence there is a need to update the precoder coefficients in response to the time-varying changes in the channel impairments.

BACKGROUND OF THE INVENTION

It is well known by those skilled in the art that the performance of a data communication system may be significantly improved by using one or more equalizers in the receiver of the data communications system. Typically equalizers eliminate most of the distortion caused by the transmission channel coupling a transmitter and a receiver. Further the equalizer attempts to whiten noise that is coupled to the channel from a variety of sources.

Those skilled in the art appreciate that a combination of a nonlinear feedback filter and a linear feedforward filter, a decision feedback equalizer ("DFE"), typically has performance that exceeds that obtained via a linear equalizer ("LEQ") having no feedback. However it is also known that a DFE is not a suitable technique when the decision process incurs delay, since most of the intersymbol interference ("ISI") energy typically occurs within the first few symbol intervals after a pulse has been received. Hence a delay in the feedback path eliminates the ability of the DFE to cancel ISI up to that amount of delay. For example a DFE can't be used with trellis coded modulation ("TCM") because of the delay that is inherent to the TCM decision process. One method to obtain performance nearly equivalent to a DFE is to use a Tomlinson-Harashima precoder ("precoder") where a feedback filter is in the transmitter rather than in the receiver. Because the precoder is in the transmitter, the delays that cause problems with TCM do not occur with a precoder/LEQ combination.

Precoders are typically initialized during a training mode when a training signal is sent from a transmitter to a receiver having a DFE. During the training mode, DFE coefficients are generated and then transferred via a return channel or back channel to the communication transmitter. The transferred DFE coefficients are then placed in a precoder feedback filter and are typically referred to as precoder coefficients or precoder taps. However once the data communication system goes from the training mode into a data mode, the precoder coefficients in prior art systems are fixed and may only be changed or updated by going back to the training mode.

There are some communication channels that have time-varying impairments such as time-varying changes in frequency response and in noise characteristics. For example, twisted pair loops in telecommunication channels that are undergoing environmental changes, such as temperature swings, may have significant distortion changes. The performance changes in a data communication system, having such time-varying impairments, has been pointed out by Rockwell in standards contribution T1E1.4/98-060, December 1997. Aerial cables, for example, may encounter large temperature swings. Such temperature swings cause changes in the resistance of the cable thereby reducing the effectiveness of the precoder. Hence a precoder having fixed coefficients can be less effective than a DFE when a communication channel has time-varying impairments.

It became apparent to those working with precoders, such as participants in the T1E1.4 work project on HDSL2, (Single Pair High-bit-rate Digital Subscriber Line) that a precoder update method during the data mode would alleviate performance degradation. One such method was suggested by Cicada Semiconductor in standards contribution T1E1.4/98-217, June 1998. Cicada implied that it was possible to develop a new set of precoder taps and periodically send them back to the receiver, replacing the previous precoder coefficients. Details of the Cicada method were not then and are not now publicly available nor available to the named inventors of the present invention. It was also questionable that the described technique actually worked since there was an unexplained 2 dB error in the contribution.

Because the data bandwidth on a back channel is limited there are restrictions on how often a complete set of coefficients may be sent from the receiver to the transmitter. Therefore it may not be possible to transfer a complete set of coefficients in a timely manner. In a typical application a precoder may have between 100 and 200 coefficients of 16 to 24 bits. For example, in an HDSL2 transmitter having a precoder, the precoder coefficient exchange protocol provides 22 bits for each coefficient. Hence there needs to be a method, apparatus and system for updating precoder coefficients that efficiently uses the typically limited bandwidth of a back channel.

SUMMARY OF THE INVENTION

One objective of the present invention is to provide an apparatus and method that updates precoder coefficients and at the same time uses the return bandwidth efficiently. Such a method and apparatus should be easy to implement within the receiver and communication system structure.

Another objective of the present invention is to provide an apparatus and method that allows a precoder and LEQ to have performance equivalent to a LEQ and DFE. It would also be desirable and is a further objective to adapt in a timely manner so there is not a significant period of time when performance is degraded.

It is yet another objective of the present invention to have a means for quickly retraining a communication system after an interruption of service. The interruption may be caused, for example, by a change in the channel or noise environment. If the change cannot be accommodated in the data mode, a quick retrain using the update method of this invention can provide improved performance. After the cause of the loss of service or degradation has disappeared, the coefficient values of the precoder and LEQ have typically remained close to optimum values. Rather than using a lengthy full retrain, the present invention is capable of transmitting a known data sequence over the communications channel and obtaining precoder increments.

Still another objective of the present invention is to have a method and apparatus that can have user selectable parameters, such as frequency of updates and convergence parameters in learning algorithms.

Hence a method and apparatus is described in figures and a preferred embodiment and meets the above objectives. In accordance with the present invention, a duplicate precoder and a correction filter are placed in the receiver for generating precoder filter increments. Because the precoder filter increments are small, the back channel is used efficiently. Performance comparisons show that the precoder has DFE like performance using the method of the present invention.

BRIEF DESCRIPTION OF THE DRAWINGS

FIG. 6 is a plot showing performance comparison.

DETAILED DESCRIPTION OF THE INVENTION

Figure 1:
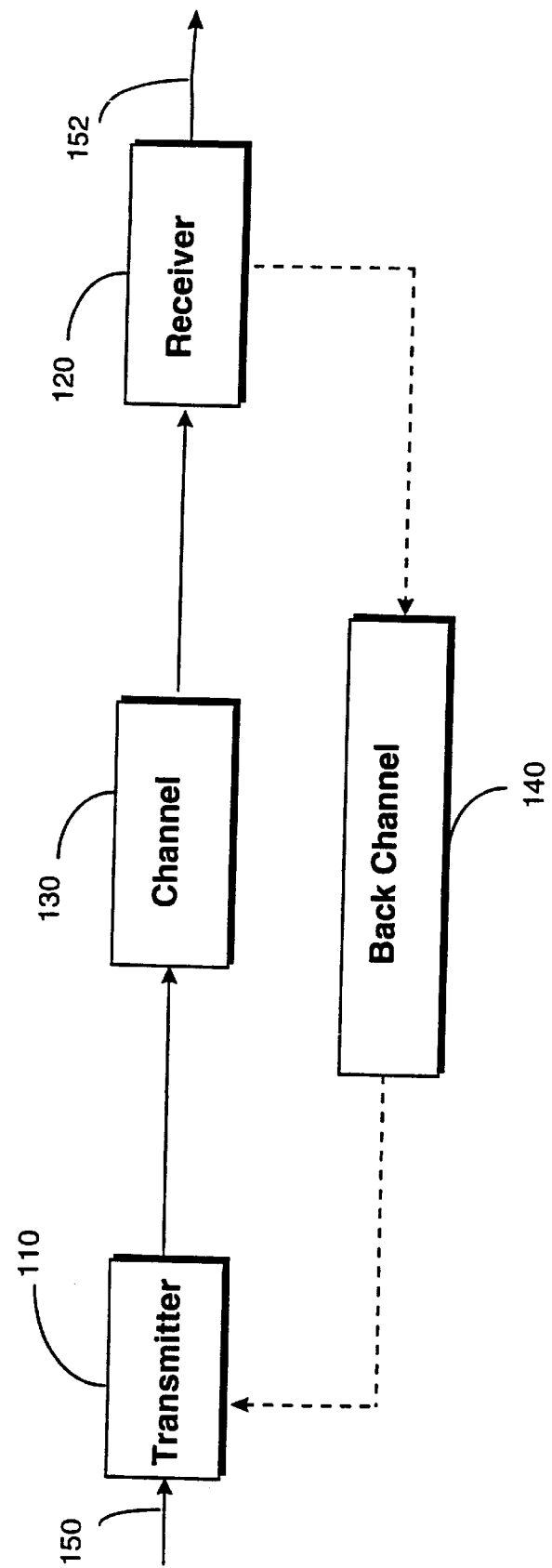
FIG. 1 is block diagram illustrating a data communication system in accordance with the present invention.

A basic communication system having a channel for transmitting information and a back channel for returning information is shown in FIG. 1. A transmitter 110 having a transmitter signal is coupled to a channel 130, which itself is coupled to a receiver 120. In the case of a data communication system, input data 150 which can be coded or uncoded is coupled to the transmitter and retrieved as output data 152 at the receiver 120. The communication system 100 of the present invention has a back channel 140 for coupling information at a relatively low data rate from the receiver 120 to the transmitter 110. For example the data going downstream, from the transmitter 110 to the receiver 120, may be sent at 1.544 Mbps and the back channel data may be sent at around 16 Kbps. In a communication system utilizing a precoder, i.e., channel precoding, in the transmitter, the back channel may have only a few hundred bits per second available for updating related precoder coefficients.

Figure 2:
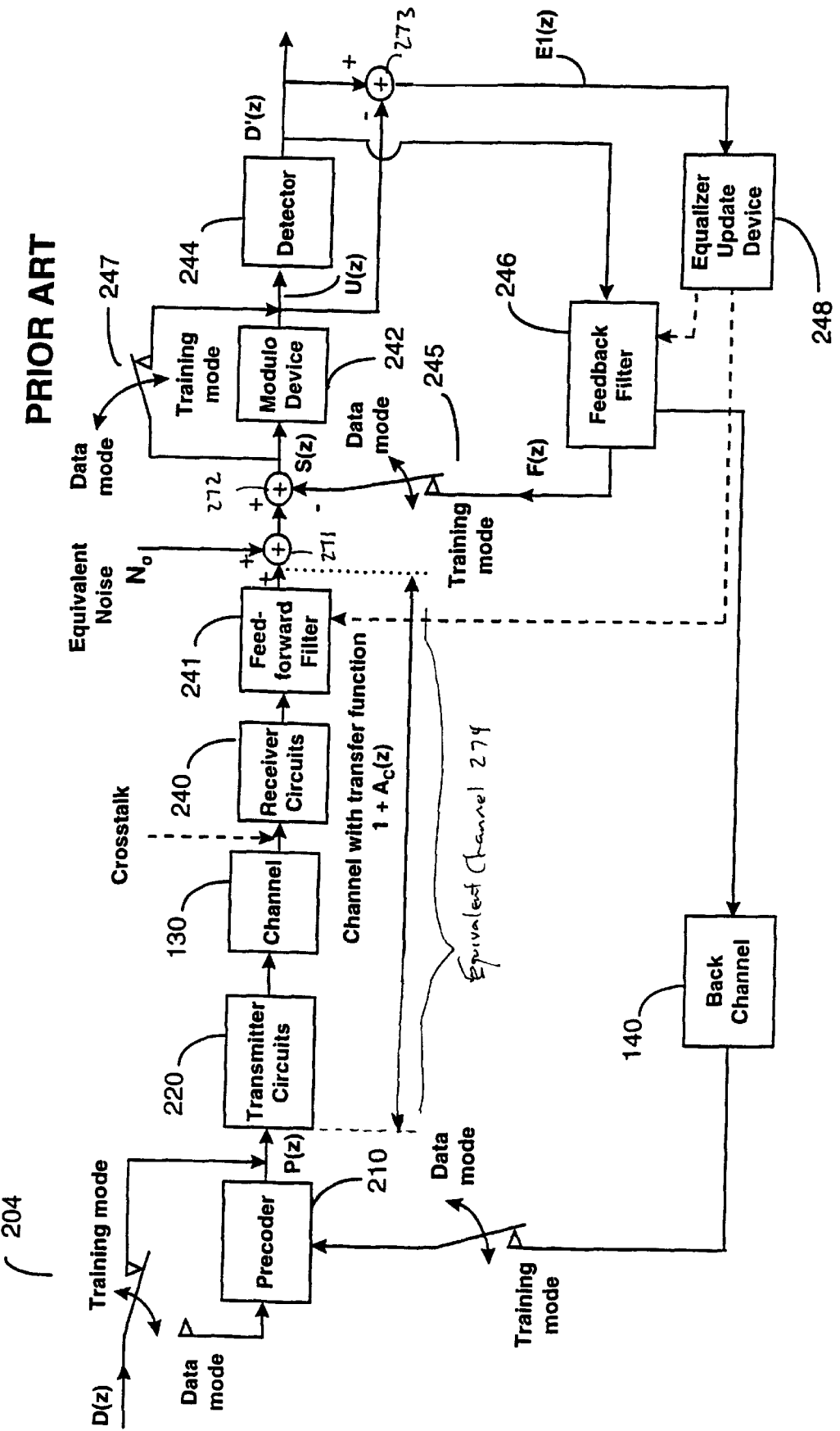
FIG. 2 is a prior art transmitter having a precoder.

FIG. 2 illustrates a simulation of a prior art data transmission system having a precoder 210. The precoder comprises a modulo device and a precoder feedback filter which are described in detail in FIG. 3. Still referring to FIG. 2, an input data signal D(z), which can be coded in the modulation sense, is the input to the precoder. Those skilled in the art would appreciate that D(z) has a limited magnitude and typically has values between −M and +M. For mathematical convenience, the input data signal may be normalized having values between −1 and +1. The coded data signal, D(z), if coded, may be formed using a variety of modulation methods, such as PAM, QAM, CAP, or other methods. The output of the prior art system is a receiver coded data signal D'(z). A discussion of the prior art system is provided to assist those skilled in the art with an understanding of the present invention. A training mode and a data mode are used in the prior art system and are described in the following paragraphs.

During a training mode, learning algorithms are active and generate coefficient values to be used during a data mode. Those skilled in the art would appreciate that when in the training mode, the coded data signal D(z) is generated by a training data sequence. When in the training mode the coded data signal, D(z), is fed directly to transmitter circuits 220 and then through the equivalent channel 274, which includes the series arrangement of the transmitter circuits 220, the channel 130, receiver circuits 240 and a feedforward filter 241.

In the data mode, equivalent noise, $N_0$ is added to the output of the equivalent channel 274, for example, as shown by summer 271 resulting in receiver input signal S(z). In the training mode, S(z) is further subject to F(z), a feedback filter signal, via summer 272 to cancel the effects of ISI. The equivalent noise contains crosstalk which is normally coupled into the data communication system between the channel 130 and the receiver circuits 240. Those skilled in the art would appreciate that the equivalent noise may be modeled as white noise because of the whitening effects of the receiver circuits and feedforward filter.

Again, in the training mode, the receiver input signal bypasses modulo device 242 via bypass switch 247 as shown in a closed position. A detector 244 then selects a value for a receiver coded data signal D'(z). A first error signal E1(z), equal to [D'(z)−U(z)], serves as an input to a equalizer update device 248. Further, during the training mode, D'(z) is an input to feedback filter 246. The output of the feedback filter goes through second switch 245, shown in a closed position in the training mode, and is then subtracted from the sum of the output of the feedforward filter 241 and the equivalent noise, $N_0$. During the training mode coefficients of the feedforward filter 241 and of the feedback filter 246 are generated. Whereas the well-known LMS algorithm is typically used to generate filter coefficients, other algorithms could be used in the prior art system of FIG. 2.

Upon completing the training mode, the coefficients of the feedback filter are transferred across the back channel 140 to the precoder 210 and become precoder filter coefficients. The coefficients of the feedforward filter are temporarily frozen, until the prior art communication system goes into the data mode.

During the data mode, the first switch directs the coded data signal D(z) to the precoder 210. The output of the precoder, P(z), then goes through the transmitter circuits 220 and the channel elements 130, 240, and 241. A receiver signal, S(z), comprises noise added to the output of the channel elements. When in the data mode, the bypass switch 247 is open and S(z) is processed by modulo device 242 resulting in modulo receiver signal, U(z), i.e., an inverted receiver signal. The detector 244 then generates the receiver coded data signal, D'(z). The first error signal E1(z) is generated as in the training mode, but now the feedback filter 246 is not operational. The first error signal, when in the data mode, is only used to update the feedforward filter 241. The equalizer update device 248, typically using the LMS algorithm, continuously updates the feedforward filter during the data mode. However, when the prior art system is in the data mode the precoder coefficients are frozen and may only be updated when the system returns to the training mode.

In the simulated prior art system of FIG. 2 the precoder coefficients are generated only during the training mode. If the performance of the prior art communication system becomes unsatisfactory, such as high bit-error rates ("BERs"), because of time changing channel impairments, it may be necessary to go from the operational mode back to the training mode to regenerate precoder coefficients. In many data communication systems, it is undesirable to go to the training mode, since data services will be interrupted. Hence there needs to be a way to update the precoder filter coefficients during the data mode of a data communications system.

Figure 3:
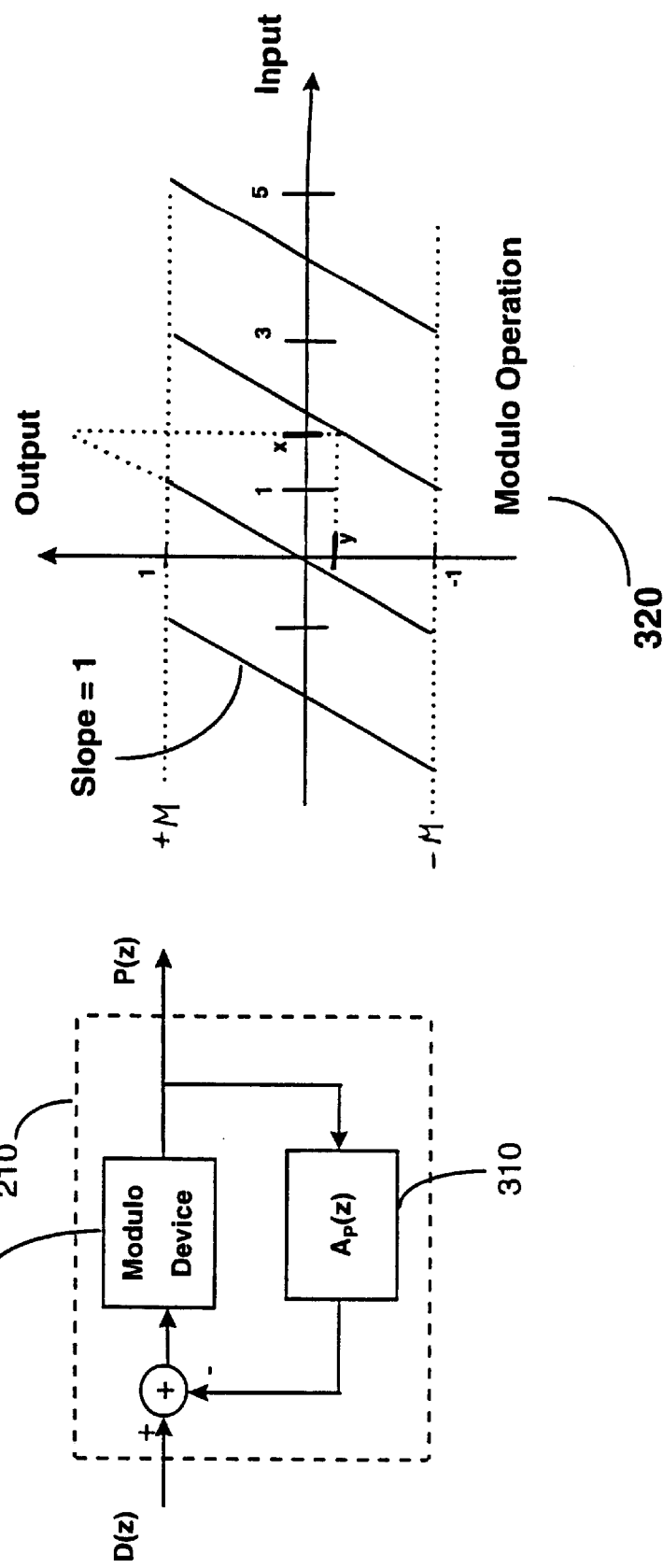
FIG. 3 is a block diagram illustrating a precoder.

The elements of a precoder are shown in FIG. 3. The precoder has a modulo device 242 that limits the maximum value of the precoder signal, P(z). Modulo devices are known to those skilled in the art of communication, but a brief description should be helpful in understanding the present invention. Mathematically the modulo operation is described, when the limits are −1 and +1, as follows: find an integer K such that $-1 \leq x+2K < +1$, then $y=x+2K$. As an example of the characteristics of a modulo device, refer to modulo graph 320. The maximum magnitude of the output signal as described by the modulo graph has a numerical value of 1. For example if the input is 0.5, the output is 0.5 since the diagonal lines have a slope of 1. When the input is 'x', having a value of around 1.70, the output is—0.3 as shown by location 'y' on the ordinate. The modulo device 242 as shown in the precoder 210 limits the value of the output magnitude to a value of one or some other selected value. The precoder also has a precoder feedback filter 310 having a transfer function $A_p(z)$ where the filter is typically a finite impulse response ("FIR") filter. The values of the FIR coefficients, i.e., the precoder filter coefficients, are generated in the receiver and sent to the transmitter via a back channel.

Figure 4:
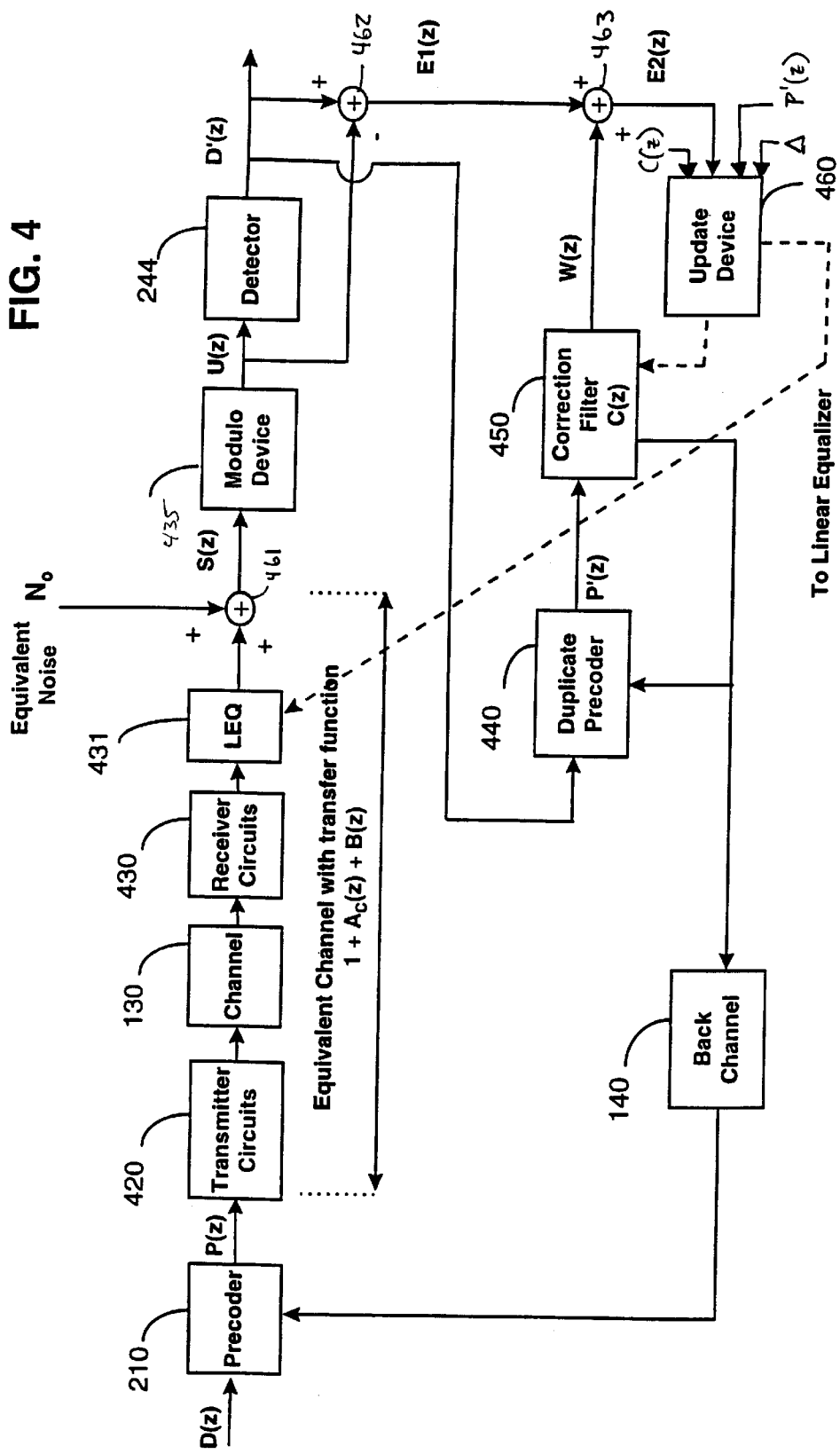
FIG. 4 is a block diagram illustrating in detail an apparatus in accordance with the present invention.

An embodiment of the present invention is shown in FIG. 4. Before the present invention becomes operational, the apparatus of FIG. 2 or a similar prior art apparatus has served as a means for setting the values of the precoder feedback filter coefficients during a startup or training mode. FIG. 4 is viewed with the assumption that initial values have been determined for $A_p(z)$ and the channel impairments may be changing with time. The coded data signal is processed by the precoder 210 and transferred via an equivalent channel to the modulo device 242. Note, the modulo device 242, i.e., an inverting device, and the precoder 210 can have, equivalently, any device having a non-linear transformation function which is invertible. The equivalent channel has a transfer function $[1+A_c(z)+B(z)]$, where $1+A_c(z)$ is the channel characteristic during the training mode and B(z) is the time varying component of the equivalent channel during the operational mode. Those skilled in the art would appreciate that the value of $A_p(z)$ is approximately equal to $A_c(z)$.

The receiver signal, S(z), is the output of the equivalent channel and additive white noise, $N_0$. The receiver signal is processed by the modulo device 242 producing a modulo receiver signal, U(z). The modulo receiver signal is processed in the detector 244 to generate a receiver data signal, D'(z), which is coded when D(z) is a coded signal in the modulation sense. In a low error environment D'(z)≈D(z), where D'(z) is a delayed version of D(z) as would be understood by those skilled in the art. A summer 462 is then used to generate a first error signal, E1(z), by subtracting U(z) from D'(z). The receiver coded data signal is also coupled to a duplicate precoder 440, wherein coefficients of the duplicate precoder 440 are updated when the precoder coefficients of precoder 210 are updated. Since the input to the duplicate precoder is approximately equal to the input of the precoder, the output of the duplicate precoder 440 is approximately equal to the output of precoder 210. The just described relation may be expressed as P'(z)≈P(z). The output of the duplicate precoder, P'(z), is coupled to a correction filter having a transfer function C(z). The coefficients of C(z) are determined by an update device 460. A summer 463 is then used to generate a second error signal E2(z), which is one input to the update device 460, where E2(z) is the sum of the output of the correction filter, W(z), and the first error signal, E1(z). Other inputs to the update device 460, include P'(z), C(z), and a gain factor "Δ". The new or updated values for the C(z) coefficients are determined by the LMS algorithm known to those skilled in the art. Other update algorithms may be used and fall within the scope of the present invention. According to the LMS algorithm, new values for the coefficients $c_n$ are equal to $c_{n-1}+\Delta p'(n-1) e_2(n-1)$ where $c_n$ and p'(n−1) are vectors. The coefficient vector $c_n$ represents the most recently updated precoder filter increments of the coefficients of C(z) used to update the precoder filter coefficients of precoder 210. The increments of the coefficients of C(z) are transferred to the transmitter over the back channel, at intervals selected by the user, and are added to the corresponding coefficients of the precoder filter at selected instants of time.

In addition to generating the coefficients of the correction filter C(z), the update device also serves to update coefficients for a linear equalizer contained in the receiver circuits. The LMS algorithm is used for the linear equalizer updates and those skilled in the art could implement the algorithm. However the second error term, E2(z), is used in the linear equalizer update instead of the first error term E1(z). The use of E2(z) ensures that the linear equalizer will not try to compensate for any distortion that can be removed by C(z).

The apparatus illustrated in FIG. 4 provides performance equal to a receiver having a DFE. Mathematical predictions and simulations have shown the steady state performance of the current invention to be within a few tenths of a decibel of a receiver having a DFE. Because most of the time-varying impairments of the channel are a result of temperature changes, there may be environments where the coefficients of C(z) are essentially zero. However, even in environments of realistic temperature changes, the rates of change of the values of the coefficients of C(z) are small (around $10^{-4}$) compared to the values of the coefficients of $A_c(z)$ (about 1.8). Hence the data bandwidth needed to send coefficient increments on the back channel is smaller than for sending the entire coefficient. Those skilled in the art would appreciate that the data rate for updating the precoder coefficients is dependent on the rate of changes in the channel. Hence an embodiment of the present invention may use a timer having a selectable update interval.

Those skilled in the art may modify the present invention as an update apparatus and method for a symmetrical communication system. When identical transceivers, at a first location and a second location are coupled by a single twisted pair, a correction filter can feed values to the precoder without the need for a back channel. For the symmetrical communication system modification of the present invention it is assumed that the frequency content of the transmitted signals at both locations are identical.

The present invention may also serve as a apparatus and method for a quick retrain. When the data mode has a sudden interruption causing loss of operation or degradation, the data communication system enters a retrain mode. The retrain mode updates the current and near optimum values of the precoder and equalizer coefficients, but uses a training signal for updating. After a predetermined time, less than the normal training time, the data communication system returns to the data mode.

Figure 5:
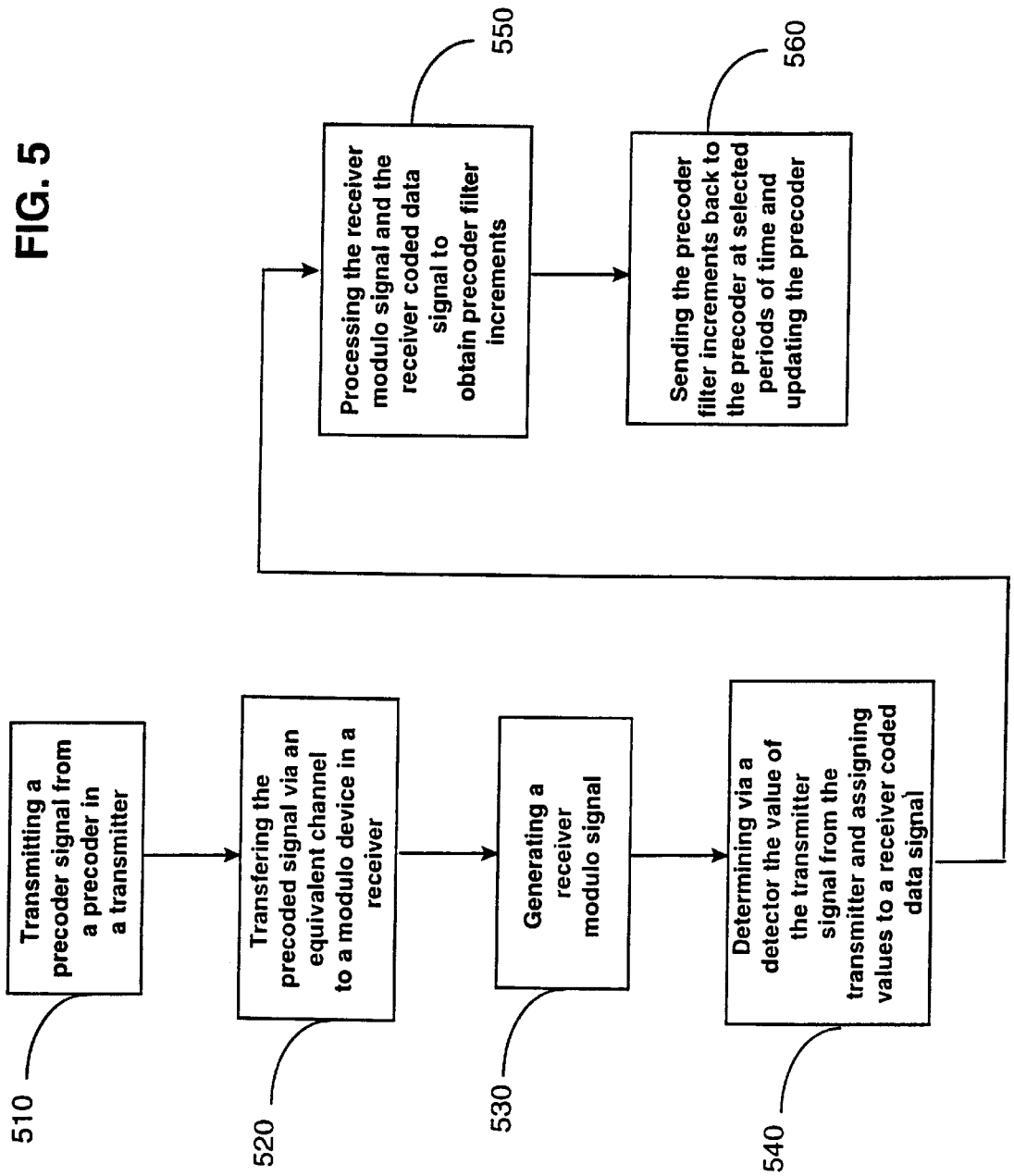
FIG. 5 is flow chart illustrating a method for updating precoder coefficients in accordance with the present invention.

FIG. 5 illustrates a method embodiment of the present invention. After a precoder signal is processed by transmitter circuits, step 510, a precoded signal is sent to a modulo device, step 520, in the receiver. The receiver then generates a receiver modulo signal, step 530. Next, the receiver modulo signal is processed by a detector to generate a receiver coded data signal, step 540. The receiver modulo signal and the receiver coded data signal are processed to determine precoder filter increments, step 550. The precoder filter increments are sent to the receiver for updating the precoder, step 560.

In order to appreciate the performance improvements provided by the precoder update apparatus and method describe above, FIG. 6 summarizes simulation results of a realistic case. The no precoder update curve 610 indicates that performance is about 7 decibels worse than when update is provided. In other words, FIG. 6 shows that the same performance can be achieved with precoding, but at a lower signal-to-noise ration. The update of precoder performance curve 620 has performance nearly as good as a DFE solution as shown in DFE curve 630. The illustration in FIG. 6 is not drawn to scale, but is an example of the trend shown in simulations of the present invention.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

The invention is further defined by the following claims:

1. In a data communication system having a transmitter with a precoder the precoder having precoder coefficients, the precoder further having a precoder signal, where the precoder signal is coupled to a receiver via an equivalent channel, where the output of the equivalent channel is a receiver signal, an apparatus for generating increments of said precoder coefficients comprising:
   a modulo device for converting the receiver signal into modulo receiver signal;
   a detector for receiving the modulo receiver signal and assigning values to the modulo receiver signal thereby generating a receiver coded data signal;
   a summer for subtracting the modulo receiver signal from the receiver coded data signal to produce a first error signal;
   a duplicate precoder for receiving and processing the receiver coded data signal thereby generating a duplicate precoder signal;
   a correction filter coupled to the output of the duplicate precoder and generating a correction filter signal where the output of the correction filter is added to the first error signal to generate a second error signal; and
   an update device coupled to the respective outputs of the correction filter and the duplicate precoder and having an update algorithm to update the correction filter coefficients of the correction filter.

2. The apparatus of claim 1, wherein the update algorithm combines the second error signal, the duplicate precoder signal, the previous values of the correction filter coefficients of the correction filter, and a gain factor $\Delta$ to update the correction filter coefficients of the correction filter.

3. The apparatus of claim 1, wherein the updated correction filter coefficients serve to update the filter coefficients of the precoder and the filter coefficients of the duplicate precoder.

4. The apparatus of claim 1, wherein the precoder receives an input signal which is generated using PAM.

5. The apparatus of claim 1, wherein the update device uses the LMS algorithm.

6. The apparatus of claim 3, wherein the update period is user selectable.

7. The apparatus of claim 1, wherein the apparatus is adapted for use in a retraining mode.

8. The apparatus of claim 2, wherein the updated correction filter coefficients serve to update the filter coefficients of the precoder and the filter coefficients of the duplicate precoder.

9. The apparatus of claim 2, wherein the precoder receives an input signal which is generated using PAM.

10. The apparatus of claim 2, wherein the update device uses the LMS algorithm.

11. The apparatus of claim 2, wherein the apparatus is adapted for use in a retraining mode.

12. In a communications system for transmitting an input data signal from a transmitter to a receiver over a channel susceptible to time-varying impairments, an apparatus for minimizing said time-varying impairments comprising:
   a precoder having an invertible non-linear transfer function in said transmitter and coupled to said channel for precoding said input data signal according to updatable precoder coefficients into a precoder signal;
   an inverting device located in said receiver and coupled to said channel for inverting said non-linear transformation function of said precoder and for converting said precoder signal into an inverted receiver signal;
   a detector coupled to said inverting device for assigning values to said inverted receiver signal to yield a receiver data signal representing said input data signal;
   a first summer coupled to said detector for subtracting said inverted receiver signal from said receiver data signal to yield a first error signal;
   a duplicate precoder located in said receiver and coupled to said summer for receiving and processing said receiver data signal to yield a duplicate precoder signal, said duplicate precoder being provided with a copy of said precoder coefficients corresponding to said precoder in said transmitter;
   a correction filter coupled to said duplicate precoder for generating a correction filter signal, said correction filter comprising updatable correction filter coefficients used to update said precoder coefficients;
   a second summer coupled to said correction filter and said first summer for adding said correction filter signal and said first error signal to yield a second error signal;
   an update device coupled to said duplicate precoder, said correction filter and said second summer, said update device having an update algorithm for updating said correction filter coefficients.

13. In a communications system for transmitting an input data signal from a transmitter to a receiver over a channel susceptible to time-varying impairments, a method for minimizing said time-varying, impairments comprising the steps of:
   preceding said input data signal in said transmitter according to updatable precoder coefficients into a precoder signal;
   converting said precoder signal into an inverted receiver signal;
   assigning values to said inverted receiver signal to yield a receiver data signal representing said input data signal;
   subtracting said inverted receiver signal from said receiver data signal to yield a first error signal;
   precoding said receiver data signal with a duplicate precoder in said receiver to yield a duplicate precoder signal, said duplicate precoder being provided with a copy of said precoder coefficients corresponding to said precoder in said transmitter;
   processing said duplicate precoder signal via a correction filter to derive a correction signal; processing correction signal and said first error signal to derive a second error signal; processing said duplicate precoder signal and said second error signal according to an update algorithm to update said correction filter coefficients; and updating said precoder coefficients with said correction filter coefficients.

14. In a data communication system having a transmitter with a precoder, the precoder having a feedback filter with precoder coefficients, the transmitter further having a transmitter signal coupled to a receiver via a channel, a method for updating precoder coefficients comprising the steps of:

receiving an impaired transmitter signal at the receiver;

processing the impaired transmitter signal to obtain a receiver signal;

executing a modulo operation on the receiver signal to obtain a modulo receiver signal;

detecting from the modulo receiver signal a receiver coded data signal;

sending the receiver coded data signal to a duplicate precoder in the receiver where the output of the duplicate precoder is a duplicate precoder signal; and processing the duplicate precoder signal, the modulo receiver signal, and the receiver coded data signal according to an update algorithm to obtain precoder filter increments, wherein the update algorithm includes the equation, $$c_n = c_{n-1} + \Delta p'(n-1) e_2(n-1),$$

where;

$c_n$ is a vector representing the new values of the correction filter coefficients;

$c_{n-1}$ is a vector representing the previous values of the correction filter coefficients;

$\Delta$ is a gain factor;

$p'(n-1)$ is a vector representing the previous values of the duplicate precoder signal; and $e_2(n-1)$ is the previous value of the second error.

* * * * *

UNITED STATES PATENT AND TRADEMARK OFFICE
CERTIFICATE OF CORRECTION

PATENT NO. : 6,314,135 B1
DATED : November 6, 2001
INVENTOR(S) : Schneider et al.

It is certified that error appears in the above-identified patent and that said Letters Patent is hereby corrected as shown below:

<u>Column 4,</u>
Line 28, "210" should read -- 210 --
Line 39, "signal'," should read -- signal, --

<u>Column 5,</u>
Line 8, "is —0.3" should read -- is -0.3 --

<u>Column 8,</u>
Line 46, "time-varying," should read -- time varying --
Line 48, "preceding" should read -- precoding --

Signed and Sealed this

Fourth Day of February, 2003

JAMES E. ROGAN
*Director of the United States Patent and Trademark Office*